United States Patent [19]

Strammello

[11] Patent Number: 4,462,010
[45] Date of Patent: Jul. 24, 1984

[54] UHF/VHF SPLITTER-BALUN ASSEMBLY

[75] Inventor: Peter Strammello, Arlington Heights, Ill.

[73] Assignee: Zenith Electronics Corporation, Glenview, Ill.

[21] Appl. No.: 456,125

[22] Filed: Jan. 6, 1983

[51] Int. Cl.³ .............................................. H03H 7/46
[52] U.S. Cl. .................... 333/126; 333/134; 333/129; 343/702; 343/850
[58] Field of Search ............... 333/129, 125, 126, 127, 333/124, 132, 134, 25, 26, 32, 33, 175, 100; 343/850, 906, 852, 853, 858–860, 820–822, 702, 816; 455/272, 273, 279–283, 193, 286; 339/177 R, 126 R, 126 J, 121, 132; 174/59, 60

[56] References Cited

U.S. PATENT DOCUMENTS 2,264,718  12/1941  Rust et al. .................... 343/859 X

FOREIGN PATENT DOCUMENTS 1163926  2/1964  Fed. Rep. of Germany ...... 333/126
1247426  8/1967  Fed. Rep. of Germany ...... 333/132

OTHER PUBLICATIONS

Harris, H., "A New Antenna Coupling System", *Radio and Television News*, Sep. 1954, pp. 117–118.
Wlasuk, S., "VHF/UHF Balun", *RCA Technical Notes*, Jan. 1967.
Middleton, R. G., "TV Antenna Accessories", *Radio Electronics*, vol. 42, No. 9, Sep. 1971, pp. 33–35, 81.

*Primary Examiner*—Paul L. Gensler
*Assistant Examiner*—Benny Lee

[57] ABSTRACT

A signal splitter-balun assembly for coupling a UHF antenna and a VHF antenna to a single input terminal of a television receiver is disclosed. RF isolation is provided by means of appropriate filtering, 60 Hz isolation is provided by means by a pair of capristors, and the required impedance transformation is provided by means of a conventional balun transformer in a low cost unit utilizing a minimum number of components.

5 Claims, 1 Drawing Figure

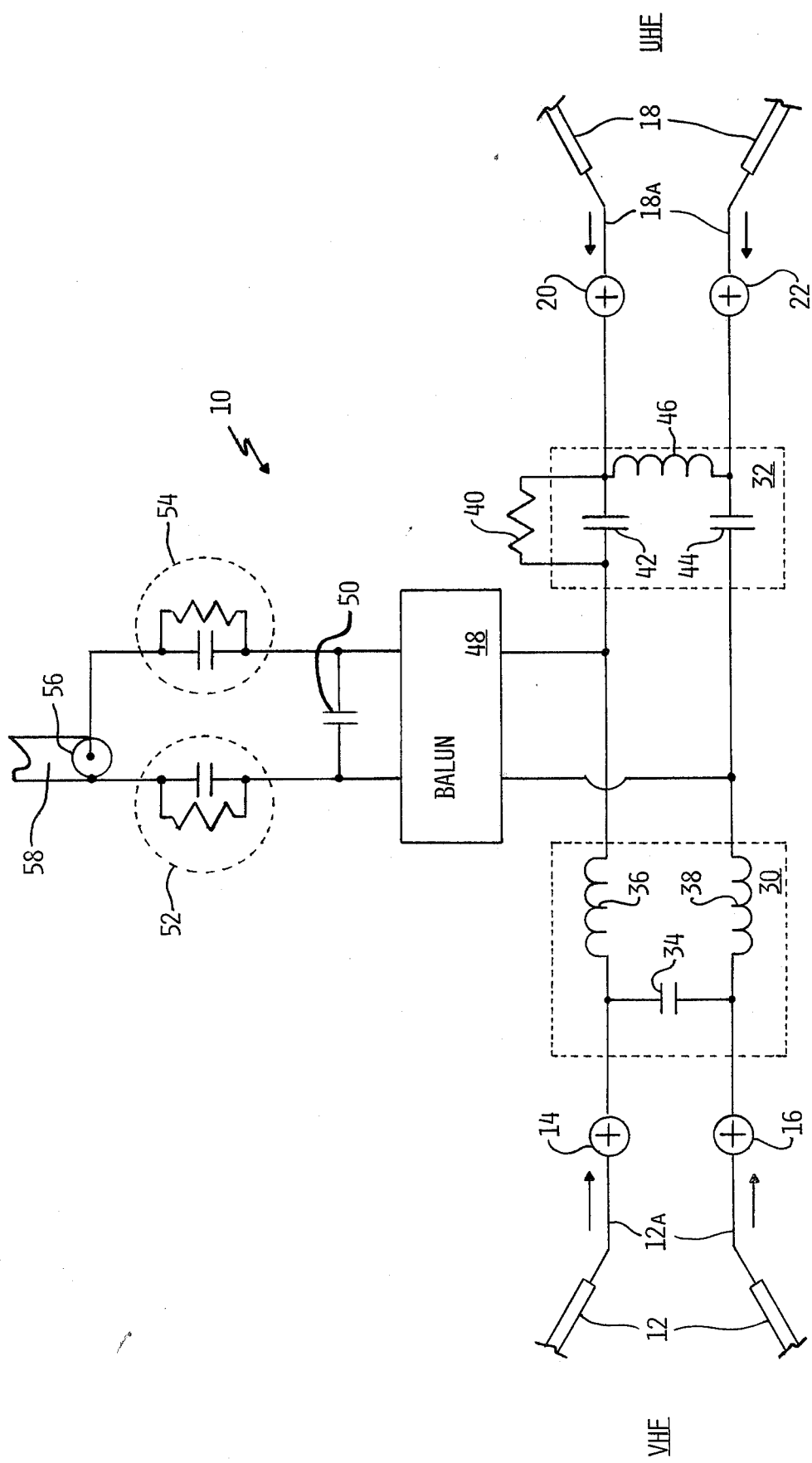

UHF/VHF SPLITTER-BALUN ASSEMBLY

BACKGROUND OF THE INVENTION

This invention relates generally to signal splitter and balun devices and is particularly directed to a device for coupling separate balanced UHF and VHF antenna leads to a single input terminal of a television receiver.

Television receivers typically include two sets of input terminals, one for receiving UHF signals and the other for receiving VHF signals. Each set of input terminals is coupled to a respective receiving antenna. The introduction of the integrated antenna capable of receiving both UHF and VHF signals gave rise to the requirement for a coupler capable of providing UHF and VHF signals from a single pair of twin leads to two sets of input terminals on the television receiver. A similar device incorporating a coaxial input terminal has found use in cable television (CATV) systems for connecting a single coaxial "drop" cable to separate pairs of UHF and VHF television receiver antenna terminals for UHF, VHF and CATV viewing. Because this type of single input-dual output coupler is not generally provided with the television receiver but rather is sold separately, it does not have to meet line voltage (120 VAC, 60 Hz) isolation safety criteria generally applicable to consumer appliances. In addition, these antenna couplers are typically provided with a large number of circuit components which substantially increases their cost.

Because of the use of a single coaxial cable in CATV systems and the increasing program selection and availability of CATV systems, television receiver manufacturers are considering, and in some cases implementing, plans for producing receivers with a single input signal terminal. See, for example, commonly assigned application Ser. No. 401,449, filed July 26, 1982, and entitled "Switching Diplexer for Single Antenna Input Television Receivers". The single input terminal approach not only reduces television receiver cost, but also simplifies installation of the television receiver and facilitates the adoption of a universal television receiver connector.

As indicated above, a television receiver having a single input terminal can easily be connected to a CATV cable. In addition, where an integrated UHF/VHF antenna is utilized, the twin lead antenna cable could be terminated in a coaxial-type connector for interfacing with the single input terminal of the television receiver. However, where separate UHF and VHF antennas with associated, respective antenna leads coupled thereto are employed, an antenna coupler for interfacing with a single input terminal on the television receiver is currently not available. In particular, because of the continued widespread use of the "rabbit ears"-type of VHF antenna mounted on the television receiver and the "bow tie"-type of UHF antenna, there is a requirement for an antenna coupler capable of providing UHF and VHF signals via separate input leads to a single input terminal of a television receiver.

Therefore, the present invention provides a UHF/VHF splitter-balun assembly capable of coupling a pair of UHF and VHF antenna twin lead conductors to a single input terminal of a television receiver.

OBJECTS OF THE INVENTION

Therefore, in view of the above, it is an object of the present invention to provide an improved antenna coupler for a television receiver.

It is another object of the present invention to provide a signal coupler for coupling separate UHF and VHF antenna leads to a single input terminal of a television receiver.

Still another object of the present invention is to provide a low cost signal splitter having high input signal isolation and low reflection and insertion losses utilizing a minimum number of components.

A further object of the present invention is to provide a high degree of antenna isolation for a television receiver.

A still further object of the present invention is to provide a low cost, double input-single output signal splitter for use as an antenna coupler for a television receiver which provides line voltage antenna isolation in satisfying standardized safety criteria.

BRIEF DESCRIPTION OF THE DRAWING

The appended claims set forth those novel features believed characteristic of the invention. However, the invention itself, as well as further objects and advantages thereof, will best be understood by reference to the following detailed description of a preferred embodiment taken in conjunction with the accompanying drawing in which is illustrated, partially in block diagram form and partially in schematic diagram form, a UHF/VHF signal splitter-balun assembly in accordance with the present invention.

DESCRIPTION OF THE PREFERRED EMBODIMENT

Referring to the FIGURE, there is shown a UHF/VHF splitter-balun assembly 10 in accordance with the present invention.

A VHF antenna 12 is coupled to respective VHF input terminals 14, 16 of the splitter-balun assembly 10 of the present invention. Similarly, a UHF antenna 18 is coupled to respective UHF input terminals 20, 22. In a preferred embodiment, the VHF and UHF antenna leads 12A, 18A are terminated in conventional lugs which readily interface with the screw-down type of input terminals of the splitter-balun assembly 10.

The VHF and UHF signals are provided to the aforementioned input terminals of splitter-balun assembly 10 via respective, balanced, twin lead, 300 ohm transmission lines 12A, 18A. The VHF input terminals 14, 16 are coupled to a low pass filter 30 comprised of inductors 36, 38 and capacitor 34. Inductors 36, 38 are coupled to input terminals 14, 16, respectively. The impedance of inductors 36, 38 is proportional to the frequency of the signal therein. Therefore, as the frequency increases, the series impedance becomes greater and prevents higher frequencies from passing but permits the lower VHF signals to be transmitted. In short, the series inductors 36, 38 allow low frequencies to pass through unchecked, but offer a high impedance to higher frequencies such as those provided via input terminals 20, 22 from the UHF antenna 18. Capacitor 34 coupled across VHF input lines 12A offers low impedance to high frequencies but acts like an open circuit with respect to lower frequencies. The value of capacitor 34 is selected such that low pass filter 30 is de-tuned with respect to UHF input signals reflected back by the VHF input terminals 14, 16. Low pass filter 30 is thus tuned by proper selection of capacitor 34 so as to attenuate UHF signals to minimize degrading signal reflections and isolate the VHF and UHF input terminals. Capacitor 34 performs this function by providing a resonant frequency to the circuit it forms with inductors 36, 38 which is lower in frequency than the UHF spectrum. By thus lowering the frequency of the self-resonant mode of the combination of low pass filter 30 and VHF antenna leads 12A, potential degradation of the received UHF signal caused by connecting VHF antenna 12 to input terminals 14, 16 is eliminated.

A high pass filter 32 comprised of capacitors 42, 44 and inductor 46 coupled thereacross is coupled to UHF input terminals 20, 22. The series capacitors 42, 44 offer low impedance to high frequency (HF) currents and the parallel inductor 46 offers a high impedance to high frequencies. Thus, the HF currents pass through filter 32 with little attenuation. To low frequencies, however, capacitors 42, 44 offer high impedance, and inductor 46 provides low impedance. Therefore, the low frequency currents cannot pass through and only the high frequency currents are transmitted by filter 32. Resistor 40 is a bleeder resistor which permits static voltages in the UHF antenna 18 to be coupled via output terminal 56 to the television receiver chassis (not shown) for discharge therein.

The VHF and UHF signals are thus provided to a balun transformer 48 which is coupled to the low and high pass filters 30, 32 which, in turn, provide a high degree of isolation for the VHF and UHF received signals. In a preferred embodiment, the balun transformer performs a 4:1 impedance matching function in matching the 300 ohm VHF and UHF antenna leads 12A, 18A with the 75 ohm coaxial cable 58 connected to output terminal 56. The output terminal 56 includes, for example, a male type F-type connector (not shown). The inductive windings of the balun transformer 48, however, cause a DC continuity to exist between each connection made at its input and output. A balun transformer having Zenith Part No. S-82103 is used in a preferred embodiment of the present invention.

The extensive use of 300 ohm antenna terminals on a television receiver has given rise to industry standards for protecting, or isolating, a viewer from electrical shock. Thus, in the present invention capristors 52, 54 are used to couple the balun transformer 48 to the output terminal 56. The capristors used in a preferred embodiment have Zenith Part. No. 105-127 and are intended to isolate the television receiver's chassis (not shown) from the VHF and UHF antennas 12, 18. Capristors 52, 54 have the operating characteristics of both a capacitor and a resistor and are rated in terms of their ability to withstand voltage. Because of their unique operating characteristics, capristors are typically specified in units of capacitance and resistance. In the present application, capristors having a capacitance rating of approximately 600 picofarads and a resistance rating of 1.2 megohms are utilized. These operating parameters permit capristors 52, 54 to pass VHF and UHF frequencies from the respective antennas 12, 18 while providing antenna terminal isolation from the 75 ohm coaxial output connections 56. As line voltage safety devices, capristors 52, 54 meet consumer product safety criteria for devices which can be placed between the user and the line voltage because of the high impedance they provide in safeguarding against electrical shock.

Capacitor 50 is coupled across capristors 52, 54 and reduces the insertion loss caused by the inclusion of capristors 52, 54 in the UHF/VHF splitter-balun assembly 10 of the present invention. Capacitor 50 tunes out the reactance which arises from the additional lead lengths introduced in the circuit by capristors 52, 54. The inductive reactance due to the capristor lead length is tuned out by the capacitive reactance of capacitor 50 coupled across capristors 52, 54.

There has thus been shown a UHF/VHF splitter-balun assembly which provides high signal isolation, low insertion loss, and a level of safety isolation and which is particularly adapted for coupling VHF and UHF antennas to a single input terminal of a television receiver. The splitter-balun assembly represents a low cost approach using a minimum number of components to provide an antenna coupling function not presently available.

While particular embodiments of the present invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matters set forth in the foregoing description and accompanying drawings is offered by way of illustration only and not as a limitation. The actual scope of the invention is intended to be defined in the following claims when viewed in their proper perspective based on the prior art.

I claim:

1. An antenna coupler for a television receiver comprising:
    a first pair of input terminals for connection to a VHF antenna;
    a second pair of input terminals for connection to a UHF antenna;
    a low pass filter coupled to said first pair of input terminals and tuned to a frequency below the UHF band;
    a high pass filter coupled to said second pair of input terminals;
    a single output terminal for coupling by means of a coaxial cable to said television receiver;
    isolation means coupled to said single output terminal for isolating voltages present in said television receiver, said isolation means including first and second capristors coupled to said single output terminal and a capacitor coupled across said first and second capristors for reducing the insertion loss of said antenna coupler; and
    impedance transformation means coupling said low and high pass filters to said first and second capristors of said isolation means for providing an impedance match between said VHF and UHF antennas and said coaxial cable.

2. An antenna coupler in accordance with claim 1 wherein said impedance transformation means includes a balun transformer.

3. An antenna coupler in accordance with claim 2 further including first and second twin lead conductors respectively coupling said first pair of input terminals with said VHF antenna and said second pair of input terminals with said UHF antenna and wherein the impedance of each of said first and second twin lead conductors is 300 ohms and the impedance of said coaxial cable is 75 ohms with said balun transformer providing a 4:1 impedance reduction from said first and second pairs of input terminals to said single output terminal.

4. An antenna coupler in accordance with claim 1 wherein said single output terminal includes a male F-type connector and said first and second pairs of input terminals include screw-down type connectors.

5. An antenna coupler for a television receiver comprising:

a first pair of input terminals for connection to a VHF antenna;

a second pair of input terminals for connection to a UHF antenna;

a low pass filter coupled to said first pair of input terminals and tuned to a frequency below the UHF band, said low pass filter including first and second inductors each coupled to a respective one of said pair of input terminals and a first capacitor coupled across said first and second inductors;

a high pass filter coupled to said second pair of input terminals, said high pass filter including second and third capacitors each coupled to a respective one of said second pair of input terminals and further including a third inductor coupled across said second and third capacitors;

a single output terminal for coupling by means of a coaxial cable to said television receiver;

isolation means coupled to said single output terminal for isolating voltages present in said television receiver, said isolation means including first and second capristors coupled to said single output terminal and a capacitor coupled across said first and second capristors for reducing the insertion loss of said antenna coupler; and impedance transformation means coupling said low and high pass filters to said first and second capristors of said isolation means for providing an impedance match between said VHF and UHF antennas and said coaxial cable.

* * * * *